US011502670B2

(12) United States Patent
Arndt et al.

(10) Patent No.: US 11,502,670 B2
(45) Date of Patent: Nov. 15, 2022

(54) ACTIVE FILTER FOR BIPOLAR VOLTAGE SOURCES

(71) Applicant: AVL Software and Functions GmbH, Regensburg (DE)

(72) Inventors: Bastian Arndt, Regensburg (DE); Peter Olbrich, Mariaposching (DE); Hartwig Reindl, Regensburg (DE)

(73) Assignee: AVL Software and Functions GmbH

( * ) Notice: Subject to any disclaimer, the term of this patent is extended or adjusted under 35 U.S.C. 154(b) by 655 days.

(21) Appl. No.: 16/485,089

(22) PCT Filed: Oct. 26, 2017

(86) PCT No.: PCT/EP2017/077518
§ 371 (c)(1),
(2) Date: Aug. 9, 2019

(87) PCT Pub. No.: WO2018/145781
PCT Pub. Date: Aug. 16, 2018

(65) Prior Publication Data

US 2020/0044625 A1 Feb. 6, 2020

(30) Foreign Application Priority Data

Feb. 9, 2017 (DE) ......................... 102017102608.8

(51) Int. Cl.
*H03H 1/00* (2006.01)
*H03H 11/12* (2006.01)
*H02M 1/15* (2006.01)

(52) U.S. Cl.
CPC ............ *H03H 11/126* (2013.01); *H02M 1/15* (2013.01); *H03H 1/0007* (2013.01)

(58) Field of Classification Search
CPC ...... H03H 11/126; H03H 1/0007; H02M 1/15
See application file for complete search history.

(56) References Cited

U.S. PATENT DOCUMENTS 3,835,390 A * 9/1974 de Sa e Silva ......... H03F 3/245 455/108
4,594,648 A 6/1986 Gallios
(Continued)

FOREIGN PATENT DOCUMENTS

DE 102015117795 A1 5/2016
EP 1686678 A1 8/2006
(Continued)

OTHER PUBLICATIONS

International Search Report for PCT/EP2017/077518, dated Jan. 4, 2018, pp. 1-4.

(Continued)

*Primary Examiner* — Dinh T Le
(74) *Attorney, Agent, or Firm* — Lerner, David, Littenberg, Krumholz & Mentlik, LLP

(57) ABSTRACT

The invention relates to a device for rejecting interference signals in bipolar voltage sources, in particular in high-voltage sources in a powertrain of an electric vehicle, wherein an amplifier circuit is provided, with an input stage the input of which is symmetrically connected by means of an electrically isolated tap to a positive power line and a negative power line of a voltage source in order to tap an interference signal, and with an output stage, actuated by the input stage, the output of which is symmetrically connected in each case via an output capacitor to the positive power line and the negative power line, in order to feed in a correction signal.

23 Claims, 3 Drawing Sheets

(56) References Cited

U.S. PATENT DOCUMENTS

Figure 1:
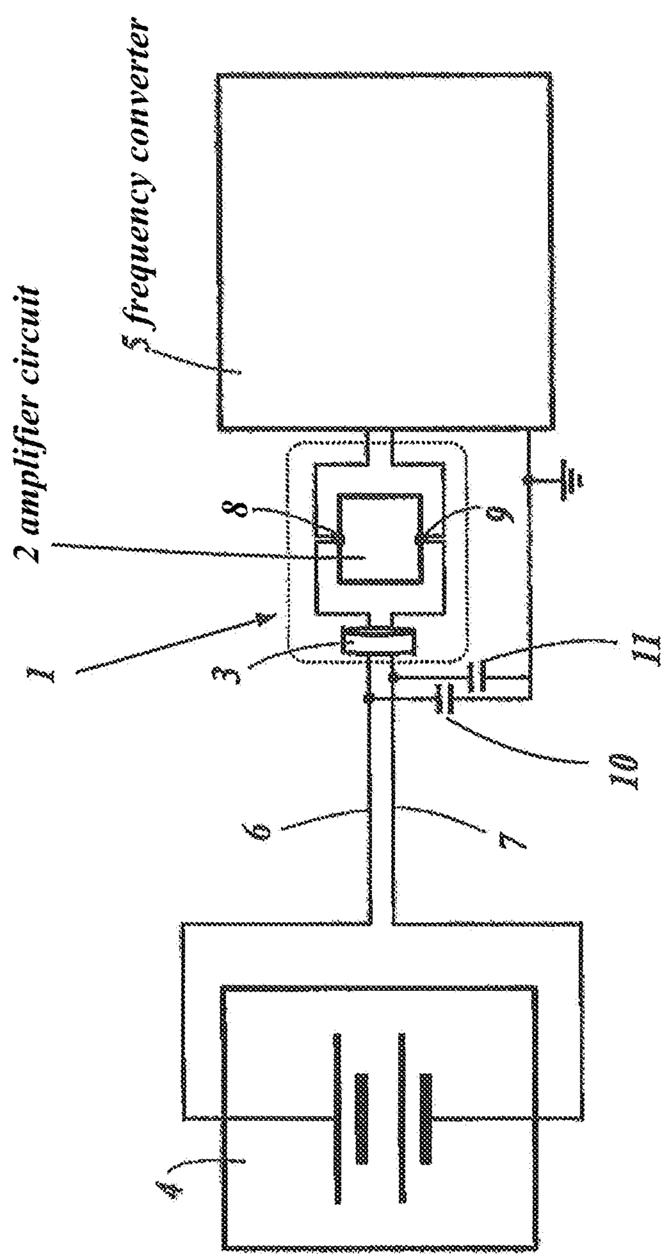

| | | | |
|---|---|---|---|
| 9,656,552 | B2 | 5/2017 | Kautz |
| 2014/0111001 | A1 | 4/2014 | Miliani |

FOREIGN PATENT DOCUMENTS

| | | | | |
|---|---|---|---|---|
| EP | 2571095 | A1 | | 3/2013 |
| EP | 3255770 | A1 | | 12/2017 |
| JP | 2003060451 | A | * | 2/2003 |
| WO | 2003005578 | A1 | | 1/2003 |
| WO | 2016173229 | A1 | | 11/2016 |

OTHER PUBLICATIONS

International Search Report for PCT/EP2017/077518, dated Aug. 16, 2018.

International Written Opinion for PCT/EP2017/077518, dated Aug. 16, 2018.

* cited by examiner

ACTIVE FILTER FOR BIPOLAR VOLTAGE SOURCES

CROSS REFERENCE TO RELATED APPLICATIONS

The present application is a national phase entry under 35 U.S.C. § 371 of International Application No. PCT/EP2017/077518, filed Oct. 26, 2017, which claims the benefit of and priority to German Patent Application No. 10 2017 102 608.8, filed Feb. 9, 2017, the entire disclosures of which are hereby incorporated herein by reference.

The invention relates to a device for rejecting interference signals in a bipolar voltage source with the features of the preamble of claim 1.

Filter assemblies for rejecting interference signals for powertrains for vehicles are known in practice. Because of the prevailing high voltages, almost exclusively passive components, which are large and expensive, are used for this.

Furthermore, active filter concepts are known, e.g. from WO 2003/005578 A1, which however are mainly used for applications in signal processing, or for applications in which lower voltages and/or lower power outputs prevail.

The object of the invention is to provide an improved, cost-effective and advantageous device for rejecting interference signals, which requires less space and has a high interference signal rejection even at higher voltages.

This object is achieved according to the invention with the subject of claim 1 and the method of claim 22.

The solution according to the invention is a device for rejecting interference signals in bipolar voltage sources, in particular for high-voltage sources in a powertrain of an electric vehicle. This device comprises an amplifier circuit with an input stage the input of which is symmetrically connected by means of an electrically isolated tap to a positive power line and a negative power line of a bipolar voltage source in order to tap an interference signal, and with an output stage, actuated by the input stage, the output of which is symmetrically connected in each case via an output capacitor to the positive power line and the negative power line, in order to feed in a correction signal. The essential point here is that the positive power line and the negative power line each have either an inductor between the point of tapping the interference signal and the voltage source, and/or a higher impedance than between the point of tapping the interference signal and a source of interference, and wherein the tapping of the interference signal and the feeding in of the correction signal in each case takes place at the same point of a power line.

The device according to the invention has the effect that an interference signal tapped at a power line is amplified in the amplifier circuit and is fed as correction signal with reverse polarity into the power line again by the output stage. The interference signal is thereby rejected. The tapping and the feeding in take place in electrically isolated manner. The electrical isolation between the amplifier and the power line in the tapping of the interference signal as well as in the coupling in of the correction signal makes it possible for the amplifier to be operated at a lower voltage level than the power line to be filtered. The use of the device according to the invention is thereby also possible at high voltages.

The inductor represents an increased inductance and prevents the fed-in correction signal from being loaded by a small impedance of the current source. An increased interference signal rejection is thus achieved via the inductor. As a result of the tapping and the feeding in at the same point, a particularly simple implementation of the device in existing systems is achieved at the same time as a high interference signal rejection. An adaptation or a modification of existing power lines is not necessary. In addition, the power line on which a high power output is transported need not be passed over the amplifier. This reduces EMC problems and a retrofitting of existing systems is greatly simplified.

An application of the device for rejecting interference signals in bipolar voltage sources can be effected above all for rejecting interference signals in drive systems of electric vehicles or hybrid vehicles. The device according to the invention can be used in the powertrain between a battery or an accumulator and a source of interference in order to reject electromagnetic interference signals, in particular common-mode interference. By common-mode interference is meant interference voltages and interference currents on the connecting lines between electrical components or electrical parts which propagate with the same phasing and direction of electric current both on the forward line and the return line between these components. Such interference signals can come for example from a source of interference or be induced by electromagnetic coupling in the power lines. In order to achieve a high interference signal rejection, the device according to the invention is installed as close as possible to the source of interference. This prevents the interference signals from propagating along the power lines and spreading into adjacent lines.

The source of interference can be for example a converter or a voltage transformer or an inverter or a speed control of an electric powertrain.

In bipolar voltage sources, a positive and a negative voltage, relative to a common ground potential, are provided simultaneously. In particular, it can be provided that the device for rejecting interference signals is formed for symmetrical voltage sources. In symmetrical voltage sources, the value of the positive and negative voltage is the same. Preferably, bipolar or symmetrical high-voltage sources comprise voltages with 50 V direct voltage, preferably 100 V direct voltage. It can be provided that the bipolar power lines each have a voltage greater than or equal to 50 volts, preferably greater than or equal to 100 volts, most preferably greater than or equal to 200 volts. Preferably, the bipolar voltage source can be a symmetrical voltage source and the symmetrical voltage sources each have a voltage greater than ±50 volts, preferably greater than or equal to ±100 volts, most preferably greater than or equal to ±200 volts. The voltage range of the device can preferably lie between 50 volts and 1000 volts.

In particular, the amplifier circuit has an active filter with discrete semiconductors, preferably transistors. By using an active filter, the components of the device turn out much smaller and also cheaper compared with a passive filter for the same frequency range or power output range. In addition, the use of discrete semiconductors guarantees a short signal transit time.

The inductor in the positive and/or the negative power line between the point of tapping the interference signal and the voltage source can be formed as coil or as ferrite core in order to increase the inductance in the supply lines of the power lines. Ferrites are electrically poor or nonconducting ferrimagnetic ceramic materials and are used in inductors in order to increase the inductance of the lines. This serves to limit currents in the power lines in the direction of the voltage source and has the effect that the action of the device for rejecting interference signals is concentrated on the source of interference.

By tapping the interference signal and feeding in the correction signal at the same point of a power line is meant that the tapping of the interference signal as well as the feeding in of the correction signal is effected at the same potential, preferably via the same terminal. In particular, in the case of a retrofitting of the device according to the invention, no interruption or rewiring of an existing power line is required. However, it is also possible that the tapping of the interference signal and/or the feeding in of the correction signal is effected via two or more separate lines or two or more separate plug-in contacts which are electrically connected in parallel and contact the same point.

It can be provided that the point of tapping the interference signal is directly connected to a source of interference via the power line. Directly connected means that the connection is effected without an additional component, in particular without increased inductance. Preferably, connections with a low ohmic resistance are provided. At the tapping point, the impedance in the direction of the voltage source is preferably greater than the impedance in the direction of the source of interference. Here, the impedance consists of the alternating current resistance and the ohmic resistance. The ratio of the impedance in the direction of the voltage source to the impedance in the direction of the source of interference can preferably be greater than 5:1, most preferably greater than 10:1 or ideally greater than 20:1. This means that the impedance in the direction of the voltage source corresponds to at least 5 times the impedance towards the source of interference, most preferably at least 10 times or ideally at least 20 times the impedance towards the source of interference. To change the ratio of the impedance, the inductor described above is arranged in the supply line of the power line in the direction of the voltage source. By increasing the inductance in the power line in the direction of the voltage source by means of the inductor, the impedance increases in the direction of the voltage source. The possible line length in the direction of the voltage source and source of interference is determined by the ratio of the impedances. The length of the power line from the point of tapping the interference signal to the source of interference is preferably less than 4 m. However, embodiments with longer power lines are also possible. Directly connected means that the connection is effected without an additional component, in particular without increased inductance. Preferably, connections with a low ohmic resistance are provided.

In order to achieve a high interference signal rejection when tapping the sensor signal and feeding in the correction signal at the same point, it is preferably provided that the amplifier has a short signal transit time. Phase shifts between the interference signal and the correction signal are thereby minimized. In this way, in particular transient or stochastic interference can also be very effectively rejected. Customary active filters have a correspondingly long settling time and are not suitable for rejecting transient or stochastic interference. It can be provided in particular that the amplifier circuit has a signal transit time between input and output which is less than or equal to 20 ns, preferably less than or equal to 10 ns, most preferably less than or equal to 6 ns. A good rejection of interference signals up to a high frequency range, preferably up to 4 MHz and above, is thereby possible. The frequency range with the best interference signal rejection can preferably lie between 1 Hz and 10 MHz, most preferably between 100 kHz and 4 MHz.

In one embodiment, it can be provided that the input stage is designed as single-stage or two-stage amplifier. Preferably, it can be provided that the input stage forms a lowpass or bandpass. The amplifier can be designed as active filter with discrete semiconductors, preferably transistors, and/or field-effect transistors. The bandpass, preferably using RC circuits or LC circuits in the transmission path, towards the lower end (low frequencies) limits the fundamental frequency of the device and towards the higher end (higher frequencies) inhibits the vibration tendencies of the amplifier by lowering the amplification in the high frequency range.

It can be provided that the output stage is formed as push-pull output stage and/or as current mirror.

To increase the output current, it can be provided that the output stage is cascadable or that the input stage actuates several cascadable output stages. In particular it can be provided that the input stage actuates two cascaded output stages or up to eight cascaded output stages.

In an embodiment that is cost-effective to produce, it can be provided that the input stage and the output stage are formed from discrete semiconductors, preferably from transistors and/or field-effect transistors. Preferably, it can be provided that the input stage and the output stage have the same type of semiconductor.

In particular, it can be provided that the voltage source has a battery or a rechargeable accumulator, in particular a traction battery, and supplies an electric motor with electrical energy, preferably supplies an electric motor in a vehicle with electrical energy.

It can be provided that the inductor has a ferrite body and the positive and/or negative power line is passed through the ferrite body. Ferrites are electrically poor or nonconducting ferrimagnetic ceramic materials and are used in inductors in order to increase the inductance of the lines.

Preferably, it can be provided that the inductor (CMC or common mode choke) has several windings of the two power lines through which current flows in opposite directions.

It can be provided that the electrical isolation, the tapping of the interference signal by a power line, is effected via a capacitor, preferably an SMD capacitor. It can be provided that the output capacitors are formed as SMD capacitors. SMD capacitors (surface-mount capacitors) are soldered directly to a circuit board by means of solderable connection surfaces. The mounting holes in the circuit board are thereby dispensed with, as a result of which a dense population as well as a two-sided population of the circuit board is possible. For the electrical isolation and/or as output capacitors, high-voltage-proof SMD capacitors can preferably be used, wherein the SMD capacitors are designed for a voltage above the voltage of the voltage source.

The electrical isolation has the effect that the amplifier can be operated at a different, in particular a lower voltage level than the power lines of the voltage source. In particular, the voltage level of the amplifier is much lower than that of the high-voltage source, preferably by a factor of 4 or more. The advantage here is that lower-cost semiconductors can be used or interference of a higher voltage level can be filtered. In addition, the operation of the amplifier circuit at a lower voltage level enables a design that is simpler in terms of construction, as it is possible to work at such a voltage level without the tighter regulations on high voltage safety applying to the amplifier circuit.

In a preferable embodiment, it can be provided that the output capacitors each have several capacitors connected in parallel. As a result of the parallel connection of the output capacitors, parasitic inductances are reduced, as a result of which the transit time in the device is reduced, the signal integrity in the device is improved and interfering voltage fluctuations are rejected.

It can be provided that the amplifier or that the input stage and the output stage have a symmetrical voltage supply, preferably have a common symmetrical voltage supply. The voltage supply of the amplifier or the input stage and/or the output stage can be derived for example from the positive and the negative power line. It can be provided, using a voltage transformer, to derive a supply voltage, preferably of ±12 V, from the high-voltage source. The advantage of deriving the supply voltage from the high-voltage source is that by contacting the device in the power lines, a voltage supply for the amplifiers is simultaneously built up.

In an alternative embodiment, the voltage supply of the amplifier or the input stage and/or the output stage can be derived from a separate low-voltage source, for example from the 12-V voltage source of a vehicle.

In order to achieve a compact overall size, a voltage transformer which derives a voltage from the positive and the negative power line or from a separate low-voltage source can be arranged near the amplifier, for example be arranged on the same circuit board.

It can be provided that the amplifier circuit is arranged with the input stage and the output stage and the output capacitors on a single circuit board or a single PCB. A small overall size is thereby achieved, and a rapid and simple assembly of the circuit board is possible. A PCB (printed circuit board) is a conductor board or a circuit board on which the electronic components are arranged, and serves to fix the components and to electrically connect the components.

It can be provided that the circuit board or the PCB has two contacting zones for electrical connection to the power lines, wherein the first contacting zone is formed for connection to the positive power line and the second contacting zone for connection to the negative power line.

In particular, it can be provided that the circuit board has a slot which is at least partially bordered by one of the contacting zones, and the electrical connection to a power line is effected in that a locking pin or a screw engages in the slot or through the slot in order to electroconductively connect the contacting zone to the power line.

The object of the invention is further achieved by an interference-suppression module for retrofittng bipolar or symmetrical voltage sources, in particular high-voltage sources in a powertrain of an electric vehicle, comprising a housing in which an amplifier circuit of a device according to the invention is accommodated.

Using such an interference-suppression module, the device for rejecting interference signals can be easily and safely installed in an electric vehicle.

It can be provided that the inductor is arranged outside the housing in the positive power line and the negative power line in each case between the point of tapping the interference signal and the voltage source.

It can be provided that the housing comprises connection means for mechanically and/or electrically connecting the amplifier circuit to the power lines of the voltage source.

It can be provided that the source of interference has a housing with an installation space or an accommodation space for accommodating the circuit board or the suppressor module, wherein the circuit board or the suppressor module is accommodated in the installation space or accommodation space and mechanically connected to the housing of the source of interference.

The object of the invention is further achieved by a method for suppressing interference in a bipolar or symmetrical voltage source which comprises a positive power line and a negative power line, wherein a device according to the invention is used and an electrical connection to an electrode of the device is produced by both the positive power line and the negative power line.

It can be provided that the electrical connection is produced by a plug-in connection or a screw connection, is preferably produced in one work step at the same time as the mechanical fixing of the circuit board or of the suppressor module.

It can be provided that a hinged ferrite core is attached to the positive and to the negative power line respectively such that the core is arranged on the power line between a battery or a rechargeable accumulator on the one hand and the connection of the device on the other.

An application of the invention can be effected for example for rejecting interference signals in the powertrain in electric vehicles. In general, the invention can be used for rejecting interference signals in electric drives with a higher power output, i.e. also for example in stationary electric motors as they are used in air-conditioning systems. Here, the invention can already be taken into consideration and used in the construction of new systems. However, the invention can supplement or replace existing filter arrangements in a retrofitting or modification of existing systems.

Figure 2:
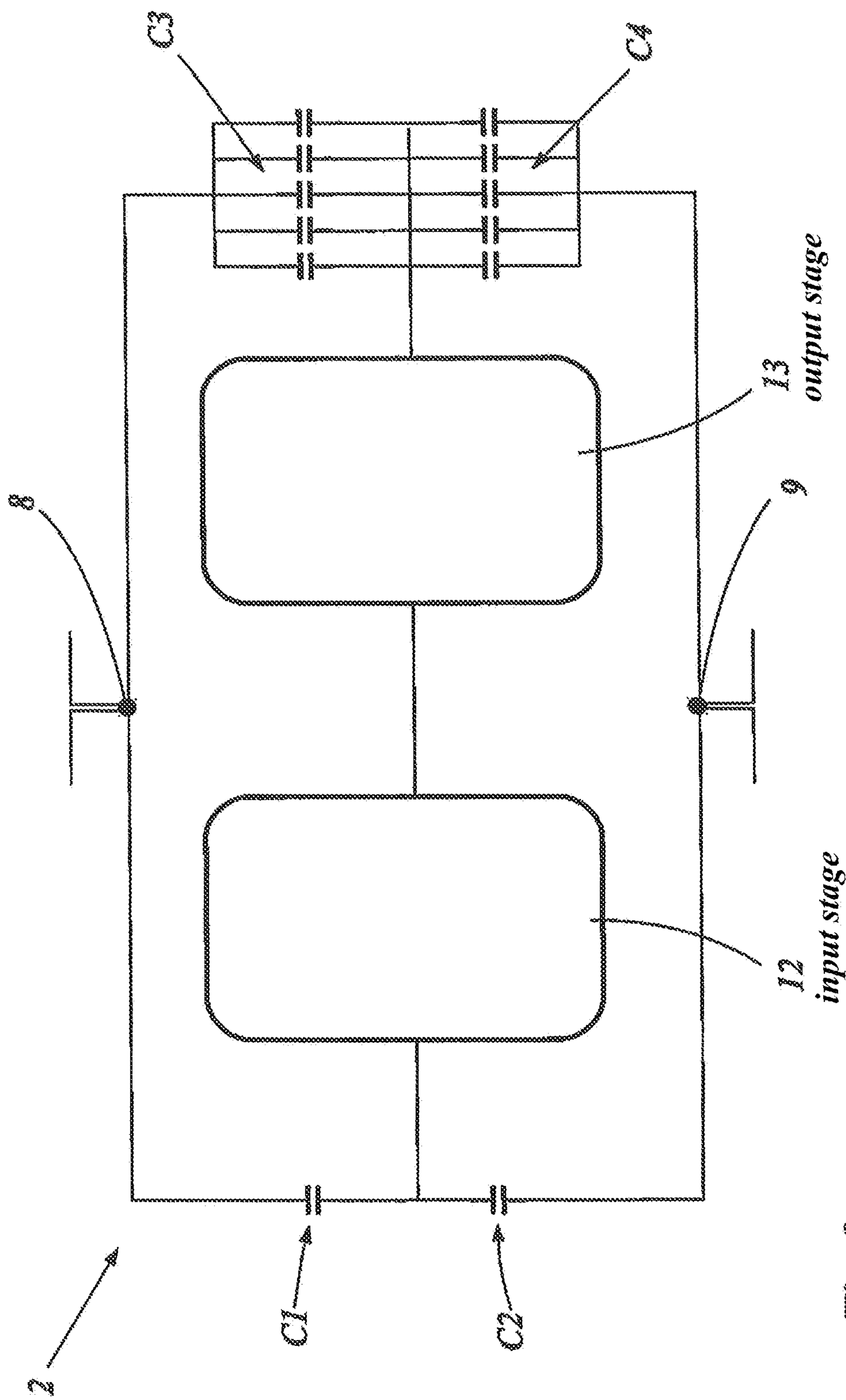
Figure 3:
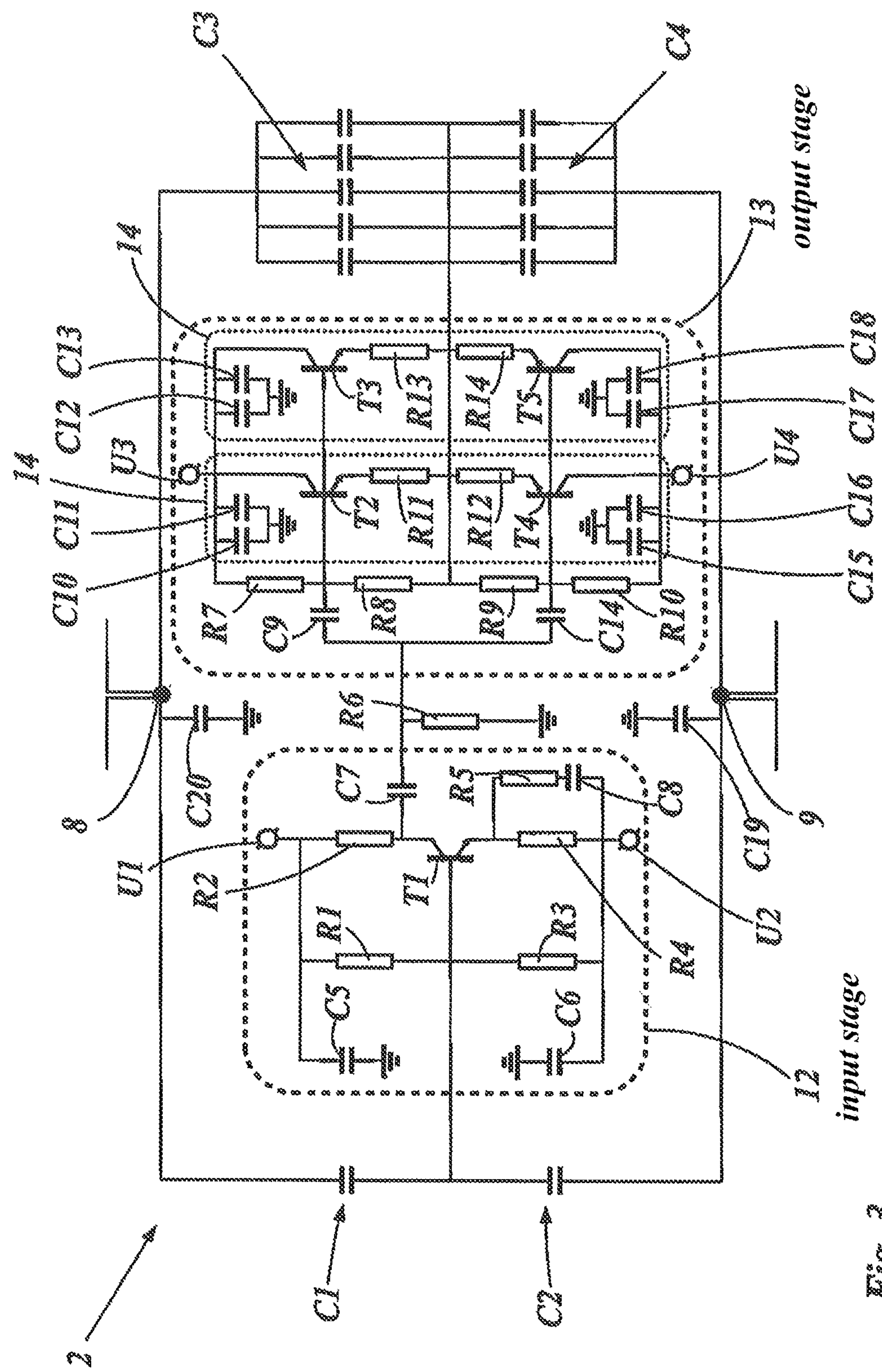

Embodiment examples of the invention are represented in the figures and explained below. There are shown in:

FIG. 1 circuit arrangement of the device according to the invention for rejecting interference signals;

FIG. 2 representation of a schematic circuit example of an amplifier circuit of the device according to the invention for rejecting interference signals;

FIG. 3 an example of a circuit of the device according to the invention for rejecting interference signals from FIG. 2.

FIG. 1 shows a circuit arrangement with a bipolar high-voltage source 4, a frequency converter 5 and a device 1 for rejecting interference signals. The device 1 has an amplifier circuit 2 and an inductor 3 and is arranged between the high-voltage source 4 and the frequency converter 5.

The amplifier circuit 2 contacts each of the power lines 6 and 7 at only one point. A first point 8 is connected to the positive power line 6. The amplifier circuit 2 is connected to the negative power line 7 at a second point 9. The signal tapping of an interference signal and the signal feeding in of the correction signal formed by the amplifier circuit is thereby effected at the same point on the positive power line 6 or the negative power line 7. The amplifier circuit 2 is arranged between the frequency converter 5 and the inductor 3.

The y-capacitors 10 and 11 shown in FIG. 1 are optionally arranged in the circuit and serve to improve the interference signal rejection.

An example of an amplifier circuit 2 is represented schematically in FIG. 2. As described above, the amplifier circuit 2 is connected to the positive power line 6 at only one first point 8 and to the negative power line at a second point 9. The amplifier circuit 2 has an input stage 12 and an output stage 13 which are electrically isolated from the power lines 6 and 7 by the capacitors C1 to C4.

The interference signal tapped from the power lines 6 and 7 is amplified in the amplifier circuit 2 and is fed as correction signal with reverse polarity into the power lines 6 and 7 again at points 8 and 9 by the output stage. The correction signal delivered by the output stage is fed directly into the two power lines 6 and 7.

As shown in FIG. 2, the output of the output stage 13 via which a correction signal is fed into the power lines 6 and 7 is connected symmetrically via several capacitors C3 and C4 to the positive power line 6 and the negative power line 7. In the embodiment example according to the invention of FIG. 2, five capacitors C3 are connected in parallel and five capacitors C4 are connected in parallel, respectively. As a result of the parallel connection of the five output capacitors C3 and C4 respectively, parasitic inductances are reduced, as a result of which the transit time in the amplifier circuit 2 is reduced, the signal integrity in the amplifier circuit 2 is improved and interfering voltage fluctuations are rejected.

The amplifier circuit 2 from FIG. 2 is represented in detail in a plugging chart in FIG. 3. It comprises the input stage 12 and the output stage 13.

The input stage 12 has a transistor T1 in a grounded emitter circuit. Via the resistors R1 and R3, the operating point is set at the base of the transistor T1. The capacitors C5 and C6 decouple the grounded emitter circuit with respect to ground. Through a symmetrical low-voltage source U1 and U2, a voltage of ±12 V is applied at the transistor T1. The collector circuit is formed via a collector resistor R2 and a decoupling capacitor C7. The emitter circuit comprises the resistors R4 and R5 and the capacitor C5 as frequency-dependent member. The capacitor C7 on the collector side of the transistor T1 acts as output capacitor of the input stage 12 for decoupling the input stage 12 and the output stage 13. A resistor R6 is arranged with respect to ground between the output of the input stage 12 and the input of the output stage 13.

The output stage 13 is connected to the input stage 12 via the input capacitors C9 and C14. The output stage has two cascaded push-pull output stages. The two transistors T4 and T2 form the first push-pull output stage and the two transistors T5 and T3 form the second push-pull output stage. The resistors R7 to R14 set the operating points at the base of the transistors T2 to T5. The transistors T2 and T3 are formed as npn transistors and the transistors T4 and T5 are formed as complementary pnp transistors. The resistors R11 and R12 or R13 and R14 serve for balancing or for current limiting in the output circuit of the push-pull circuits. The capacitors C10, C11, C15 and C16 are provided for reasons of interference decoupling and decouple the voltage supply with respect to ground.

In the output stage 13, up to eight push-pull output stages can be cascaded which are connected to a third low-voltage source U3 (+12 V) and a fourth low-voltage source U4 (−12 V).

For simplicity's sake, the input stage 12 and the output stage 13 can be fed from the same symmetrical low-voltage source. In this case, U1 is equal to U3 and U2 is equal to U4. Alternatively, separate symmetrical low-voltage sources U1, U2 or U3, U4 can be used for the input stage 12 and the output stage 13, respectively.

The symmetrical low-voltage source U1, U2 or U3, U4 can be fed from the high-voltage source via a voltage transformer. Alternatively, the low-voltage source U1, U2 or U3, U4 can be fed from a separate power supply, for example a 12-V or 24-V power circuit of a vehicle.

LIST OF REFERENCE NUMBERS

1 device for rejecting interference signals
2 amplifier circuit
3 inductor
4 high-voltage source
5 frequency converter
6 positive power line
7 negative power line
8 first connection point
9 second connection point
10 first y-capacitor
11 second y-capacitor
12 input stage
13 output stage
14 push-pull output stage
C1 to C18 capacitor
R1 to R14 resistor
T1 to T5 transistor
U1 first low-voltage source
U2 second low-voltage source
U3 third low-voltage source
U4 fourth low-voltage source

The invention claimed is:

1. A device for rejecting interference signals in a bipolar voltage source, comprising:

an amplifier circuit with an input stage, an input of the input stage being symmetrically connected at a tap point, to a positive power line and a negative power line of the bipolar voltage source via respective input capacitors; and an output stage coupled to the input stage to generate a correction signal, an output of the output stage being symmetrically connected, at the tap point, to the positive power line and the negative power line via respective output capacitors, wherein the device has an inductor coupled between the tap point and the bipolar voltage source, and/or an impedance at the tap point in the direction of the bipolar voltage source that is higher than an impedance at the tap point in the direction of a source of interference, and wherein the interference signals are suppressed.

2. The device for rejecting interference signals according to claim 1, wherein the tap point is directly connected to theft source of interference via the positive power line and the negative power line.

3. The device for rejecting interference signals according to claim 1, wherein the amplifier circuit has a signal propagationtransit time between input and output which is less than or equal to 20 ns.

4. The device for rejecting interference signals according to claim 1, wherein the input stage is a single-stage or two-stage amplifier.

5. The device for rejecting interference signals according to claim 1, wherein the output stage is a push-pull output stage or a current mirror.

6. The device for rejecting interference signals according to claim 1, wherein the output stage is cascadable and the input stage is coupled to several cascaded stages making up the output stage.

7. The device for rejecting interference signals according to claim 1, wherein the input stage and the output stage are formed as discrete semiconductors.

8. The device for rejecting interference signals according to one claim 1, wherein the bipolar voltage source has a battery or a rechargeable accumulator and supplies an electric motor with electrical energy.

9. The device for rejecting interference signals according to claim 1, wherein the positive power line and the negative power line each have a voltage magnitude greater than or equal to 50 volts.

10. The device for rejecting interference signals according to claim 1, wherein the inductor has a ferrite body and the positive and/or negative power line is passed through the ferrite body.

11. The device for rejecting interference signals according to claim 1, wherein the source of interference is a converter or a voltage transformer or an inverter or a speed control of an electric powertrain.

12. The device for rejecting interference signals according to claim 1, wherein the output capacitors are formed as SMD capacitors.

13. The device for rejecting interference signals according to claim 1, wherein the output capacitors each have several capacitors connected in parallel.

14. The device for rejecting interference signals according to claim 1, wherein the input stage and the output stage have a symmetrical voltage supply which is either derived from the positive power line and the negative power line or is derived from a separate low-voltage source.

15. The device for rejecting interference signals according to claim 1, wherein the amplifier circuit is arranged with the input stage and the output stage and the output capacitors on a single circuit board or a single PCB.

16. The device for rejecting interference signals according to claim 15, wherein the circuit board or the PCB has two contacting zones for the electrical connection to the power lines, wherein the first contacting zone is formed for connection to the positive power line and the second contacting zone for connection to the negative power line.

17. The device for rejecting interference signals according to claim 16, wherein the circuit board has a slot which is at least partially bordered by one of the contacting zones, and the electrical connection to a power line is effected in that a locking pin or a screw engages in the slot or through the slot in order to electroconductively connect the contacting zone to the power line.

18. An interference suppression module for retrofitting for bipolar voltage sources, comprising a housing in which an amplifier circuit of a device according to claim 1 is accommodated.

19. The interference-suppression module according to claim 18, wherein the housing comprises connection means for mechanically and/or electrically connecting the amplifier circuit to the positive power line and the negative power line of the bipolar voltage source.

20. The device according to claim 1, wherein the source of interference has a housing with an installation space for accommodating a circuit board or the amplifier circuit, wherein the circuit board or the amplifier circuit is accommodated in the installation space and mechanically connected to the housing of the source of interference.

21. A method for suppressing interference in a bipolar voltage source comprising a positive power line and a negative power line, the method comprising:

providing a device comprising an amplifier circuit with an input stage, an input of the input stage being symmetrically connected at a tap point, to a positive power line and a negative power line of the bipolar voltage source via respective input capacitors, and an output stage coupled to the input stage to generate a correction signal, an output of the output stage being symmetrically connected, at the tap point, to the positive power line and the negative power line via respective output capacitors, wherein the device has an inductor coupled between the tap point and the bipolar voltage source, and/or an impedance at the tap point in the direction of the bipolar voltage source that is higher than an impedance at the tap point in the direction of a source of interference, and wherein the interference signals are suppressed; and producing an electrical connection to an electrode of the device by the positive power line and by the negative power line.

22. The method according to claim 21, wherein the electrical connection is produced by a plug-in connection or a screw connection.

23. The method according to claim 21, wherein a hinged ferrite core is attached in each case to the positive power line and to the negative power line such that the core is arranged on the power lines between a battery or a rechargeable accumulator on the one hand and the connection of the device on the other.

* * * * *